(12) United States Patent
Kim

(10) Patent No.: US 11,919,421 B2
(45) Date of Patent: Mar. 5, 2024

(54) HEATING PAD CONTROL APPARATUS

(71) Applicant: LG Energy Solution, Ltd., Seoul (KR)

(72) Inventor: Ki-Hoon Kim, Daejeon (KR)

(73) Assignee: LG Energy Solution, Ltd. (KR)

( * ) Notice: Subject to any disclaimer, the term of this patent is extended or adjusted under 35 U.S.C. 154(b) by 126 days.

(21) Appl. No.: 17/612,261

(22) PCT Filed: Oct. 5, 2020

(86) PCT No.: PCT/KR2020/013499
§ 371 (c)(1),
(2) Date: Nov. 18, 2021

(87) PCT Pub. No.: WO2021/071184
PCT Pub. Date: Apr. 15, 2021

(65) Prior Publication Data
US 2022/0212567 A1  Jul. 7, 2022

(30) Foreign Application Priority Data
Oct. 10, 2019  (KR) .................. 10-2019-0125481

(51) Int. Cl.
*H01M 10/48* (2006.01)
*B60L 58/27* (2019.01)
(Continued)

(52) U.S. Cl.
CPC ........... *B60L 58/27* (2019.02); *H01M 10/486* (2013.01); *H01M 10/615* (2015.04);
(Continued)

(58) Field of Classification Search
None
See application file for complete search history.

(56) References Cited

U.S. PATENT DOCUMENTS

| 5,508,126 A | 4/1996 | Braun |
| 2008/0042621 A1 | 2/2008 | Miglioranza |

(Continued)

FOREIGN PATENT DOCUMENTS

| CN | 101399441 A | 4/2009 |
| CN | 103166284 A | 6/2013 |

(Continued)

OTHER PUBLICATIONS

International Search Report for PCT/KR2020/013499 dated Jan. 29, 2021. 2 pgs.

(Continued)

*Primary Examiner* — Lisa S Park
(74) *Attorney, Agent, or Firm* — Lerner David LLP

(57) ABSTRACT

A heating pad control apparatus capable of preventing a battery pack from maintaining a high-temperature state by controlling an operating state of a heating pad based on a temperature of the battery pack and a current flowing through the battery pack. There is an advantage in that the temperature of the battery pack may be prevented from rising above a certain level. Accordingly, since the temperature of the battery pack is maintained at a certain level, damage to the elements provided in the battery pack is reduced, and the use efficiency of the battery pack may be improved.

10 Claims, 4 Drawing Sheets

(51) Int. Cl.
*H01M 10/615* (2014.01)
*H01M 10/625* (2014.01)
*H01M 10/63* (2014.01)

(52) U.S. Cl.
CPC ......... *H01M 10/625* (2015.04); *H01M 10/63* (2015.04); *H01M 2220/20* (2013.01)

(56) References Cited

U.S. PATENT DOCUMENTS

| | | |
|---|---|---|
| 2009/0085519 A1 | 4/2009 | Kim |
| 2009/0202889 A1 | 8/2009 | Mori |
| 2013/0154541 A1 | 6/2013 | Stickelmaier et al. |
| 2015/0144614 A1 | 5/2015 | Kim et al. |
| 2015/0210181 A1 | 7/2015 | Niioka et al. |
| 2015/0323603 A1 | 11/2015 | Kim et al. |
| 2016/0126760 A1* | 5/2016 | Murata ................. B60L 1/02 320/107 |
| 2017/0250549 A1 | 8/2017 | Jin |
| 2018/0328993 A1* | 11/2018 | Yasunori ............... H02J 7/14 |
| 2019/0016232 A1* | 1/2019 | Kim ..................... H01M 10/44 |
| 2019/0379217 A1* | 12/2019 | Song .................... B60L 58/10 |

FOREIGN PATENT DOCUMENTS

| | | |
|---|---|---|
| CN | 104640734 A | 5/2015 |
| CN | 105576741 A | 5/2016 |
| CN | 107667449 A | 2/2018 |
| CN | 108352716 A | 7/2018 |
| JP | 2006320048 A | 11/2006 |
| JP | 2008061490 A | 3/2008 |
| JP | 2014038734 A | 2/2014 |
| JP | 6396185 B2 | 9/2018 |
| KR | 20150059247 A | 6/2015 |
| KR | 101551088 B1 | 9/2015 |
| KR | 20160014508 A | 2/2016 |
| KR | 101784740 B1 | 11/2017 |
| KR | 20180116625 A | 10/2018 |
| KR | 101962957 B1 | 3/2019 |

OTHER PUBLICATIONS

Extended European Search Report including Written Opinion for Application No. 20873445.9 dated May 13, 2022, pp. 1-6.

* cited by examiner

HEATING PAD CONTROL APPARATUS

CROSS-REFERENCE TO RELATED APPLICATIONS

The present application is a national phase entry under 35 U.S.C. § 371 of International Application No. PCT/KR2020/013499 filed Oct. 5, 2020, published in Korean, which claims priority from Korean Patent Application No. 10-2019-0125481 filed Oct. 10, 2019, all of which are incorporated herein by reference.

TECHNICAL FIELD

The present disclosure relates to a heating pad control apparatus, and more particularly, to a heating pad control apparatus for controlling an operating state of a heating pad provided to a battery pack.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Meanwhile, in general, since a battery and a battery pack including the battery have a sealed structure, they have a risk of a fire or explosion accident due to heat generated inside. Therefore, for safe use of the battery pack, when the temperature of the battery pack reaches a certain level or higher, it is necessary to lower the temperature of the battery pack by eliminating the heat generation factor.

Patent Literature 1 discloses an integrated active fuse module for shorting a fuse by sensing a voltage value conducted to a battery and a temperature of heat emitted through the battery, and a method for preventing overvoltage through the same.

However, since Patent Literature 1 discloses a configuration for shorting a disposable fuse, there is a problem that the battery pack cannot be reused. That is, Patent Literature 1 discloses a configuration for cutting the fuse of the battery pack when reaching a temperature at which the battery pack cannot be reused, and there is a problem in that it is impossible to solve the heat generation factor itself that increases the temperature of the battery pack.
(Patent Literature 1) KR 10-2018-0116625 A

SUMMARY

Technical Problem

The present disclosure is designed to solve the problems of the related art, and therefore the present disclosure is directed to providing a heating pad control apparatus capable of preventing a battery pack from maintaining a high-temperature state by controlling an operating state of a heating pad based on the temperature of the battery pack and the current flowing through the battery pack.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a heating pad control apparatus connected to a battery pack.

The heating pad control apparatus according to an aspect of the present disclosure may comprise a sensor configured to measure a temperature of the battery pack and output a measured temperature signal corresponding to the measured temperature of the battery pack; a processor configured to output a reference temperature signal corresponding to a preset reference temperature; and a heating control circuit configured to receive the measured temperature signal from the sensor, receive the reference temperature signal from the processor, and output a control signal for controlling an operating state of a heating relay, wherein the heating relay is disposed on a heating line to generate heat on a main charging and discharging line when a current flows in the heating line, wherein the operating state of the heating relay is configured to control the current flowing in the heating line and is based on both-end voltages of a main relay disposed between a positive electrode terminal of a battery module of the battery pack and a positive electrode terminal of the battery pack on a main charging and discharging, the measured temperature signal and the reference temperature signal to control the operating state of a heating pad disposed on the heating line.

In response to a turn-on control signal being output from the heating control circuit, the operating state of the heating relay may be configured to change to a turn-on state so that the main charging and discharging line and the heating pad are connected.

In response to an operating state of the main relay and the operating state of the heating relay are controlled to a turn-on state, the heating pad may be configured to receive a current output from the battery module.

The heating control circuit may include a first comparator configured to receive a first end voltage and a second end voltage of the main relay, respectively, and output a voltage comparison signal corresponding to a difference between the first end voltage and the second end voltage of the main relay; a second comparator configured to output a temperature comparison signal corresponding to a result obtained by comparing sizes of the received measured temperature signal and the received reference temperature signal; and a control signal output circuit configured to receive the voltage comparison signal and the temperature comparison signal and output a control signal corresponding to values of the voltage comparison signal and the temperature comparison signal.

The first comparator may be configured to output a first voltage comparison signal in response to the difference between the first and second end voltages being smaller than a predetermined size, and the first comparator may be configured to output a second voltage comparison signal in response to the difference between the first and second end voltages being greater than or equal to the predetermined size.

The second comparator may be configured to output a first temperature comparison signal in response to the value corresponding to the measured temperature signal being greater than or equal to a value corresponding to the reference temperature signal, and the second comparator may be configured to output a second temperature comparison signal in response to the value corresponding to the measured temperature signal being smaller than the value corresponding to the reference temperature signal.

In response to the first voltage comparison signal being received from the first comparator and the first temperature comparison signal being received from the second comparator, the control signal output circuit may be configured to output a turn-off control signal for changing the operating state of the heating relay to a turn-off state.

The processor may be configured to receive the measured temperature signal from the sensor and control the operating state of the heating relay based on a result obtained by comparing the measured temperature measured by the sensor and the set reference temperature.

A battery pack according to another aspect of the present disclosure may comprise the heating pad control apparatus according to an aspect of the present disclosure.

A vehicle according to still another aspect of the present disclosure may comprise the heating pad control apparatus according to an aspect of the present disclosure.

Advantageous Effects

According to an aspect of the present disclosure, there is an advantage in that the temperature of the battery pack may be prevented from rising above a certain level. Accordingly, since the temperature of the battery pack is maintained at a certain level, damage to the elements provided in the battery pack is reduced, and the use efficiency of the battery pack may be improved.

In addition, according to an aspect of the present disclosure, since the temperature of the battery pack is prevented from rising above a reference temperature by using the heating control unit and the processor, there is an advantage in that the risk of an accident caused by the increase of the temperature of the battery pack is remarkably reduced.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
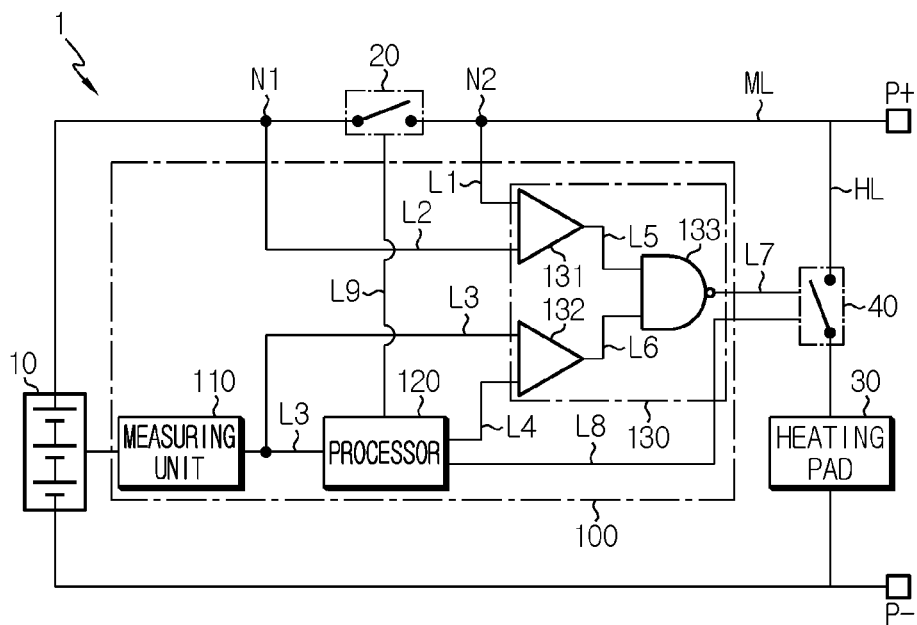
FIG. 1 is a diagram showing an exemplary configuration of a battery pack including a heating pad control apparatus according to an embodiment of the present disclosure.

FIG. 1 is a diagram showing an exemplary configuration of a battery pack 1 including a heating pad control apparatus 100 according to an embodiment of the present disclosure.

Referring to FIG. 1, the battery pack 1 may include a battery module 10, a main relay 20, a heating pad 30, a heating relay 40, and a heating pad control apparatus 100.

Here, the battery module 10 may be at least one battery cell connected in series and/or in parallel. In addition, the battery cell refers to one independent cell that has a negative electrode terminal and a positive electrode terminal and is physically separable. For example, one pouch-type lithium polymer cell may be regarded as the battery cell.

Specifically, the battery pack 1 may include a main relay 20 disposed between a positive electrode terminal of the battery module 10 and a positive electrode terminal P+ of the battery pack 1 on a main charging and discharging line ML. For example, referring to FIG. 1, the main charging and discharging line ML may be a large current path that connects the positive electrode terminal P+ of the battery pack 1, the battery module 10 and a negative electrode terminal P− of the battery pack 1. The main relay 20 may be connected to the main charging and discharging line ML so that one end thereof is connected to the battery module 10 and the other end thereof is connected to the positive electrode terminal P+ of the battery pack 1.

The heating pad 30 may be disposed on a heating line HL connected to the main charging and discharging line ML and configured to generate heat when a current is applied thereto. For example, referring to FIG. 1, the heating line HL may be connected to the positive electrode terminal P+ and the negative electrode terminal P− of the battery pack 1 in parallel.

In addition, the heating relay 40 for controlling the flow of current flowing through the heating line HL according to an operating state may be provided on the heating line HL. For example, referring to FIG. 1, if the operating state of the heating relay 40 is controlled to a turn-on state, the current flowing through the main charging and discharging line ML may be applied to the heating pad 30. As another example, if the operating state of the heating relay 40 is controlled to a turn-off state, the current may not be applied to the heating pad 30.

The heating pad control apparatus 100 according to an embodiment of the present disclosure may be connected to the battery pack 1 and configured to control an operating state of the heating pad 30 provided in the battery pack 1.

Figure 2:
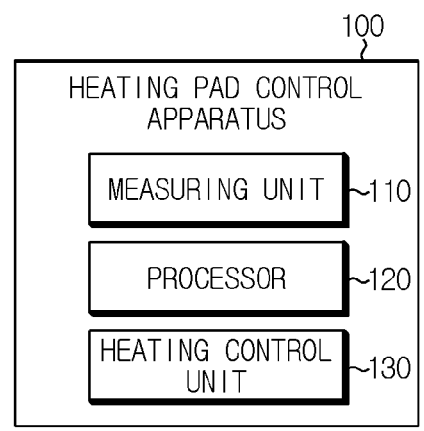
FIG. 2 is a diagram schematically showing the heating pad control apparatus according to an embodiment of the present disclosure.

FIG. 2 is a diagram schematically showing the heating pad control apparatus 100 according to an embodiment of the present disclosure.

Referring to FIG. 2, the heating pad control apparatus 100 according to an embodiment of the present disclosure may include a measuring unit 110, a processor 120, and a heating control unit 130.

The measuring unit 110 may be configured to measure a temperature of the battery pack 1.

For example, the measuring unit 110 may include a general temperature sensor to measure the temperature of the battery pack 1. In addition, referring to FIG. 1, the measuring unit 110 may be connected to the battery module 10 to measure the temperature of the battery module 10.

The measuring unit 110 may be configured to output a measured temperature signal corresponding to the measured temperature of the battery pack 1.

Specifically, the measuring unit 110 may convert the measured temperature of the battery pack 1 into a digital signal. In addition, the measuring unit 110 may output the converted digital signal through a line connected to an output terminal.

For example, in the embodiment of FIG. 1, the measured temperature signal corresponding to the temperature of the battery pack 1 measured by the measuring unit 110 may be output through a third line L3.

The processor 120 may be configured to output a reference temperature signal corresponding to a preset reference temperature.

Here, the preset reference temperature may mean an upper limit temperature in a preset normal temperature range for the battery pack 1. That is, the preset reference temperature may be a critical temperature at which the battery pack 1 may operate normally.

Specifically, the processor 120 may generate a reference temperature signal indicating the preset reference temperature and output the generated reference temperature signal.

For example, in the embodiment of FIG. 1, the reference temperature signal generated by the processor 120 may be output through a fourth line L4.

The heating control unit 130 may be configured to receive the measured temperature signal from the measuring unit 110. In addition, the heating control unit 130 may be configured to receive the reference temperature signal from the processor 120.

Specifically, the heating control unit 130 may be connected to the measuring unit 110 and the processor 120, respectively. For example, referring to FIG. 1, the heating control unit 130 may be connected to the measuring unit 110 through the third line L3 and connected to the processor 120 through the fourth line L4.

In addition, the heating control unit 130 may receive the measured temperature signal from the measuring unit 110 through the third line L3 and receive the reference temperature signal from the processor 120 through the fourth line L4.

The heating control unit 130 be configured to control the operating state of the heating pad 30 by outputting a control signal for controlling the operating state of the heating relay 40 based on both-end voltages of the main relay 20, the measured temperature signal and the reference temperature signal.

Specifically, the heating control unit 130 may output a control signal for controlling the operating state of the heating relay 40 based on the both-end voltages of the main relay 20 disposed on the main charging and discharging line ML of the battery pack 1, the measured temperature signal received from the measuring unit 110, and the reference temperature signal received from the processor 120.

Here, the control signal output from the heating control unit 130 may be a signal that controls the operating state of the heating relay 40 to a turn-on state or a turn-off state. That is, if the heating relay 40 receives the control signal output from the heating control unit 130, the operating state of the heating relay 40 may be changed to a turn-on state or a turn-off state.

In addition, by controlling the operating state of the heating relay 40, the operating state of the heating pad 30 may be controlled.

For example, in the embodiment of FIG. 1, if the operating state of the heating relay 40 is a turn-on state and a current flows through the main charging and discharging line ML, a current is applied to the heating pad 30 so that the heating pad 30 may be operated. That is, the heating pad 30 may generate heat.

As another example, if the operating state of the heating relay 40 is a turn-off state, the heating pad 30 may not operate regardless of whether a current flows through the main charging and discharging line ML. Therefore, if the operating state of the heating relay 40 is controlled to a turn-off state, the temperature of the battery pack 1 may gradually decrease because the heating pad 30 is not operated.

That is, the heating pad control apparatus 100 according to an embodiment of the present disclosure may control the operating state of the heating pad 30 based on the state of the battery pack 1 (for example, the both-end voltages of the main relay 20 and the temperature of the battery pack 1).

Therefore, since the temperature of the battery pack 1 is maintained at a certain level, it is possible to prevent internal components of the battery pack 1 from being exposed to high temperature. In particular, it is possible to prevent that the temperature of the battery pack 1 is maintained above a reference temperature to damage lines, relays or resistors inside the battery pack 1 due to high temperature. In addition, since the temperature of the battery module 10 may be prevented from rising by the temperature of the battery pack 1, accidents such as explosion of the battery module 10 may be prevented.

Meanwhile, the processor 120 provided to the heating pad control apparatus 100 may optionally include a processor 120 known in the art, an application-specific integrated circuit (ASIC), another chipset, a logic circuit, a register, a communication modem, a data processing device, and the like in order to execute various control logics performed in the present disclosure. In addition, when the control logic is implemented in software, the processor 120 may be implemented as a set of program modules. In this case, the program module may be stored in a memory and executed by the processor 120. The memory may be provided in or out of the processor 120 and may be connected to the processor 120 through various well-known means.

The heating relay 40 may be configured to connect the main charging and discharging line ML and the heating pad 30 by changing the operating state to a turn-on state, if a turn-on control signal is output from the heating control unit 130.

Referring to FIG. 1, one end of the heating line HL may be connected between the positive electrode terminal P+ of the battery pack 1 and the other end of the main relay 20. That is, one end of the heating line HL may be connected to a second node N2 between the positive electrode terminal P+ of the battery pack 1 and the other end of the main relay 20. In addition, the other end of the heating line HL may be connected between the negative electrode terminal P− of the battery pack 1 and the negative electrode terminal of the battery module 10. Accordingly, the heating line HL may be connected in parallel with the battery module 10 to the main charging and discharging line ML of the battery pack 1.

In addition, the heating pad 30 and the heating relay 40 may be connected in series to the heating line HL.

For example, referring to FIG. 1, one end of the heating relay 40 may be connected to the positive electrode terminal P+ of the battery pack 1 on the heating line HL, and one end of the heating pad 30 and the other end of the heating relay 40 may be directly connected. In addition, the other end of the heating pad 30 may be connected to the negative electrode terminal P− of the battery pack 1 on the heating line HL.

Therefore, if the operating state of the heating relay 40 is controlled to a turn-on state, the main charging and discharging line ML and the heating pad 30 may be electrically connected.

In addition, the heating pad 30 may be configured to receive the current output from the battery module 10, if the operating states of the main relay 20 and the heating relay 40 are controlled to a turn-on state.

Here, the operating state of the main relay 20 may be controlled by the processor 120. For example, in the embodiment of FIG. 1, the processor 120 may be electrically connected to the main relay 20 through a ninth line L9. In addition, the processor 120 may control the operating state of the main relay 20 to a turn-on state or a turn-off state by outputting a signal for controlling the operating state of the main relay 20 through the ninth line L9.

Figure 3:
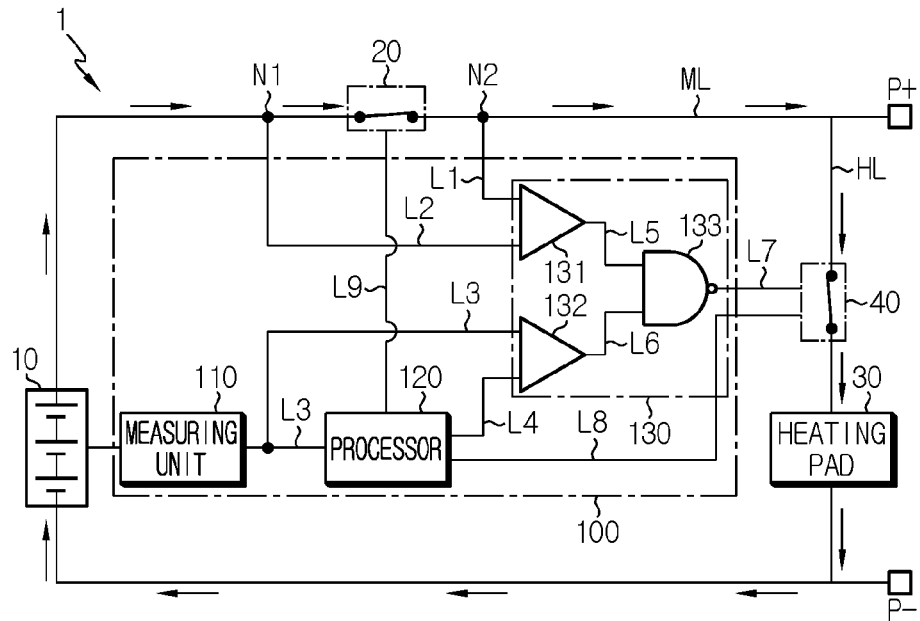
FIG. 3 is a diagram showing a first example of the current flowing in the battery pack.

FIG. 3 is a diagram showing a first example of the current flowing in the battery pack 1. In FIG. 3, arrows indicate the direction in which the current output from the battery module 10 flows.

Referring to FIG. 3, if the operating states of the main relay 20 and the heating relay 40 are controlled to a turn-on state, a closed circuit may be formed through the battery module 10, the main relay 20, the heating relay 40 and the heating pad 30.

That is, the current output from the battery module 10 may be applied to the heating pad 30 through the main relay 20 and the heating relay 40. In this case, the heating pad 30 to which the current is applied may generate heat and increase the temperature of the battery pack 1.

Referring to FIGS. 1 and 3, the heating control unit 130 may include a first comparator 131, a second comparator 132, and a control signal output unit 133.

The first comparator 131 may be configured to receive one end voltage and the other end voltage of the main relay 20, respectively.

Specifically, the first comparator 131 may have two input terminals. The first input terminal of the first comparator 131 may be connected to a node between one end of the main relay 20 and the battery module 10 to receive one end voltage of the main relay 20. In addition, the second input terminal of the first comparator 131 may be connected to a node between the other end of the main relay 20 and the positive electrode terminal P+ of the battery pack 1 to receive the other end voltage of the main relay 20.

For example, in the embodiment of FIG. 1, the first comparator 131 may be connected to a first node N1 through the second line L2. In addition, the first comparator 131 may receive one end voltage of the main relay 20 through the second line L2. In addition, the first comparator 131 may be connected to the second node N2 through the first line L1. In addition, the first comparator 131 may receive the other end voltage of the main relay 20 through the first line L1.

The first comparator 131 may be configured to output a voltage comparison signal corresponding to a difference between the received both-end voltages of the main relay 20. That is, the first comparator 131 may have one output terminal.

For example, in the embodiment of FIG. 1, the output terminal of the first comparator 131 may be connected to a fifth line L5. Accordingly, the first comparator 131 may output the voltage comparison signal corresponding to the difference between one end voltage and the other end voltage of the main relay 20 through the fifth line L5. Here, the output voltage comparison signal may be input to the control signal output unit 133 through the fifth line L5.

The second comparator 132 may be configured to output a temperature comparison signal corresponding to a result obtained by comparing sizes of the received measured temperature signal and the received reference temperature signal.

Specifically, like the first comparator 131, the second comparator 132 may have two input terminals. The first input terminal of the second comparator 132 may be connected to the measuring unit 110 to receive the measured temperature signal from the measuring unit 110. In addition, the second input terminal of the second comparator 132 may be connected to the processor 120 to receive the reference temperature signal from the processor 120.

For example, in the embodiment of FIG. 1, the second comparator 132 may be connected to the measuring unit 110 through the third line L3. The second comparator 132 may receive the measured temperature signal output from the measuring unit 110 through the third line L3. In addition, the second comparator 132 may be connected to the processor 120 through the fourth line L4. The second comparator 132 may receive the reference temperature signal output from the processor 120 through the fourth line L4.

In addition, the second comparator 132 may output the temperature comparison signal corresponding to the result obtained by comparing the sizes of the received measured temperature signal and the received reference temperature signal through a sixth line L6. Preferably, the second comparator 132 may have one output terminal.

For example, in the embodiment of FIG. 1, the output terminal of the second comparator 132 may be connected to the sixth line L6. Accordingly, the second comparator 132 may output the temperature comparison signal through the sixth line L6. Here, the output temperature comparison signal may be input to the control signal output unit 133 through the sixth line L6.

The control signal output unit 133 may be configured to receive the voltage comparison signal and the temperature comparison signal and output a control signal corresponding to values of the voltage comparison signal and the temperature comparison signal.

The control signal output unit 133 may have two input terminals. The voltage comparison signal output from the first comparator 131 may be input to the first input terminal of the control signal output unit 133. In addition, the temperature comparison signal output from the second comparator 132 may be input to the second input terminal of the control signal output unit 133.

For example, in the embodiment of FIG. 1, to the control signal output unit 133, the voltage comparison signal may be input through the fifth line L5 and the temperature comparison signal may be input through the sixth line L6.

In addition, the control signal output unit 133 may have an output terminal. The control signal output unit 133 may output a control signal for the heating relay 40 through the output terminal.

For example, in the embodiment of FIG. 1, a seventh line L7 may be connected to the output terminal of the control signal output unit 133. In addition, the seventh line L7 may be connected to the heating relay 40. Accordingly, the control signal output from the control signal output unit 133 may be transmitted to the heating relay 40 through the seventh line L7, so that the operating state of the heating relay may be controlled to an operating state corresponding to the control signal.

The first comparator 131, the second comparator 132 and the control signal output unit 133 may be configured to output a signal corresponding to an input signal without separate control of the processor 120. That is, the first comparator 131 may output a voltage comparison signal corresponding to the received both-end voltages of the main relay 20 even if there is no control of the processor 120. Also, the second comparator 132 may output a temperature comparison signal corresponding to a result obtained by comparing the sizes of the received measured temperature signal and the received reference temperature signal even if there is no control of the processor 120. In addition, the control signal output unit 133 may output a control signal corresponding to a level of the received voltage comparison signal and the received temperature comparison signal even if there is no control of the processor 120. Therefore, even if there is no separate control by the processor 120, the operating state of the heating pad 30 may be automatically controlled according to the state of the battery pack 1, thereby preventing the temperature of the battery pack 1 from rising above a certain level in advance.

Hereinafter, a problem of the battery pack 1 in which the heating control unit 130 is not provided and the operating state of the heating relay 40 is controlled by the processor 120 will be described. It is assumed that the operating states of the main relay 20 and the heating relay 40 of the battery pack 1 are a turn-on state and a problem occurs in software of the processor 120 or a connection between the processor 120 and the heating relay 40. In this case, since the current output from the battery module 10 is continuously applied to the heating pad 30, the temperature of the battery pack 1 rises continuously, and an accident such as explosion of the battery pack 1 may occur.

Meanwhile, even if a problem occurs in software of the processor 120 or a connection between the processor 120 and the heating relay 40, the battery pack 1 including the heating pad control apparatus 100 according to an embodiment of the present disclosure may control the operating state of the heating relay 40 by the heating control unit 130. That is, since the heating control unit 130 is configured to output a signal corresponding to an applied signal even if there is no control of the processor 120, the operating state of the heating pad 30 may be controlled even if the above problem occurs.

Therefore, there is an advantage in that the temperature of the battery pack 1 may be prevented from rising above a certain level by the heating pad control apparatus 100 according to an embodiment of the present disclosure. In addition, since the temperature of the battery pack 1 is maintained at a certain level, damage to elements provided in the battery pack 1 may be reduced, and the use efficiency of the battery pack 1 may be improved.

The first comparator 131 may be configured to output a first voltage comparison signal if the difference between the both-end voltages is smaller than a predetermined size. In addition, the first comparator 131 may be configured to output a second voltage comparison signal if the difference between the both-end voltages is greater than or equal to the predetermined size.

Here, the predetermined size may be set equal to the voltage of the battery module 10. Preferably, the predetermined size may be set smaller than the voltage of the battery module 10 in consideration of the voltage of the battery module 10 and the internal resistance of the main relay 20. However, hereinafter, for convenience of description, it will be described that the predetermined size is set equal to the voltage of the battery module 10 without considering the internal resistance of the main relay 20.

For example, it is assumed that the voltage of the battery module 10 is 10 [V] and the predetermined size is set to 10 [V]. If one end voltage of the main relay 20 is 10 [V] and the other end voltage thereof is 9.9 [V], the difference between the both-end voltages of the main relay 20 is 0.1 [V]. That is, since the difference (0.1 [V]) between the both-end voltages of the main relay 20 is smaller than the predetermined size (10 [V]), the first comparator 131 may output the first voltage comparison signal.

As another example, if one end voltage of the main relay 20 is 10 [V] and the other end voltage thereof is 0 [V], the difference (10 [V]) between the both-end voltages of the main relay 20 is equal to the predetermined size (10 [V]), so the first comparator 131 may output the second voltage comparison signal.

As still another example, if one end voltage of the main relay 20 is 10 [V] and the other end voltage thereof is 7 [V], the difference (3[V]) between the both-end voltages of the main relay 20 is smaller than the predetermined size (10 [V]), so the first comparator 131 may output the first voltage comparison signal. This case will be described with reference to FIGS. 4 and 5.

Figure 4:
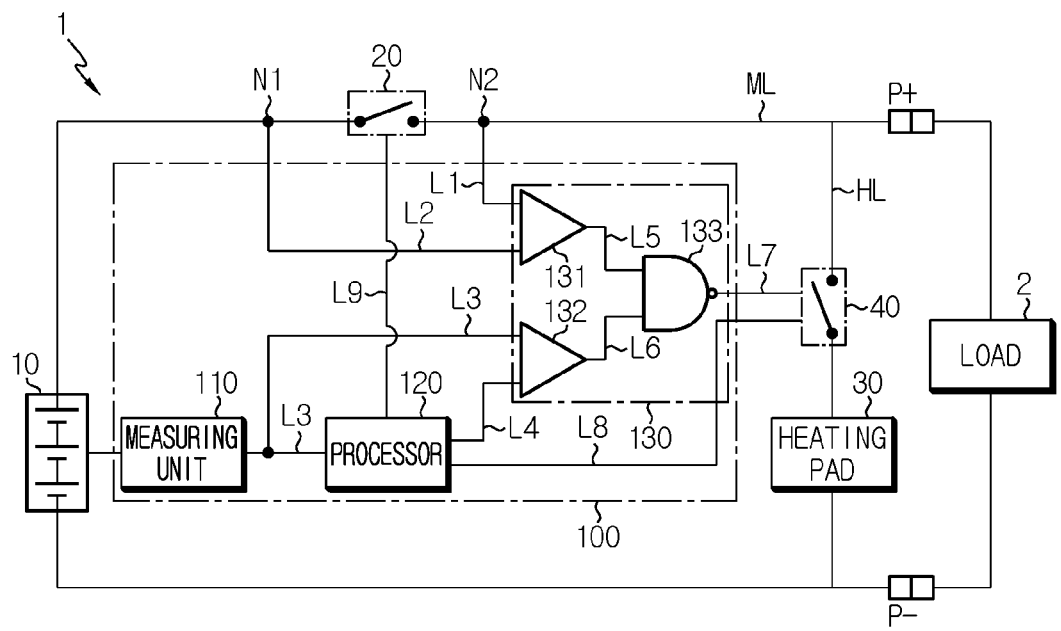
FIG. 4 is a diagram showing an exemplary configuration in which a load is connected to the battery pack including the heating pad control apparatus according to an embodiment of the present disclosure.
Figure 5:
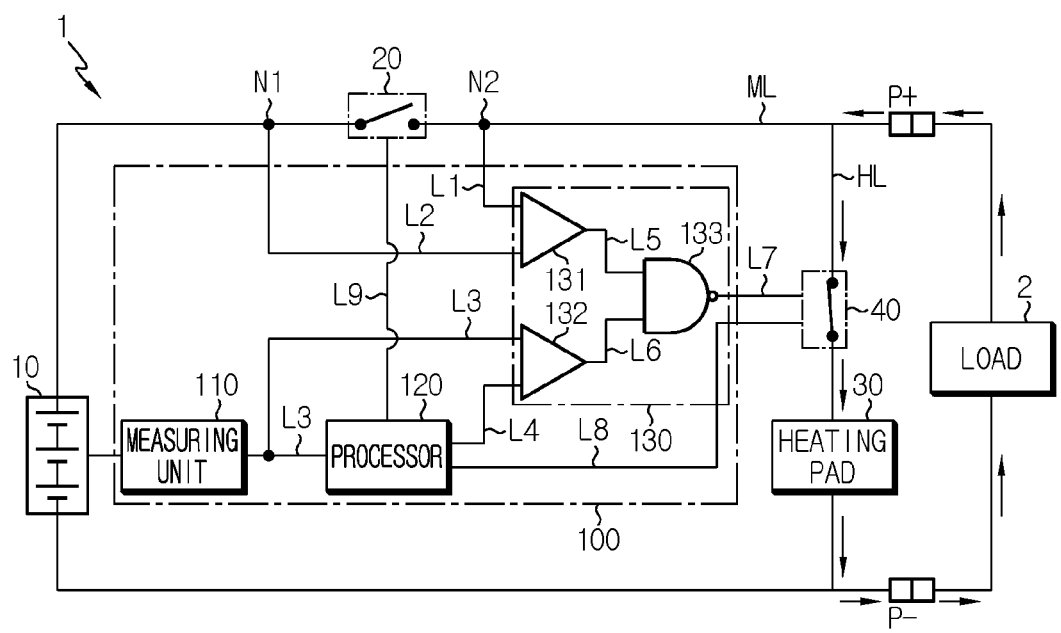
FIG. 5 is a diagram showing a second example of the current flowing in the battery pack.

FIG. 4 is a diagram showing an exemplary configuration in which a load 2 is connected to the battery pack 1 including the heating pad control apparatus 100 according to an embodiment of the present disclosure. FIG. 5 is a diagram showing a second example of the current flowing in the battery pack 1. In FIG. 5, arrows indicate the direction in which the current output from the load 2 flows.

Referring to FIGS. 4 and 5, even if the operating state of the main relay 20 is a turn-off state, if the battery pack 1 and the load 2 are connected, the voltage of the load 2 may be applied to the second node N2. In addition, in this case, if the operating state of the heating relay 40 is a turn-on state, a closed circuit may be formed by the load 2, the heating relay 40 and the heating pad 30, so that the current output from the load 2 may be applied to the heating pad 30. Therefore, the heating pad 30 may generate heat by the current output from the load 2.

In addition, for example, a smoothing capacitor for maintaining a constant voltage level may be further included in the battery pack 1. In the capacitor, a voltage corresponding to the battery module 10 may be stored. That is, if the operating state of the main relay 20 is changed to a turn-off state to release the connection between the battery module 10 and the capacitor, the current stored in the capacitor may be emitted. In this case, if the operating state of the heating relay 40 is controlled only based on the operating state of the main relay 20, there is a problem that the heating pad 30 may generate heat by the current output from the capacitor.

Meanwhile, the first comparator 131 may not output a corresponding voltage comparison signal in consideration of only the operating state of the main relay 20, but may output a corresponding voltage comparison signal in consideration of a difference between the both-end voltages of the main relay 20. That is, in the case where the heating pad 30 receives the current from the battery module 10 and in the case where the heating pad 30 receives the current from other than the battery module 10, the operating state of the heating relay 40 may be controlled in the same manner.

Therefore, since the heating pad control apparatus 100 according to an embodiment of the present disclosure considers the difference between the both-end voltages of the main relay 20, there is an advantage in that the heating pad 30 is prevented from unexpectedly generating heat by the current applied from not only the battery module 10 but also other than the battery module 10.

The second comparator 132 may be configured to output the first temperature comparison signal if a value corresponding to the measured temperature signal is greater than or equal to a value corresponding to the reference temperature signal. In addition, the second comparator 132 may be configured to output the second temperature comparison signal if the value corresponding to the measured temperature signal is smaller than the value corresponding to the reference temperature signal.

Here, the value corresponding to the reference temperature signal may be an upper limit temperature in a normal temperature range of the battery pack 1. For example, the upper limit temperature of the normal temperature range of the battery pack 1 may be set to 60° C. Accordingly, the reference temperature signal may be a signal corresponding to 60° C., and the value corresponding to the reference temperature signal may be 60° C.

That is, the second comparator 132 may be configured to output the first temperature comparison signal if the temperature of the battery pack 1 actually measured by the measuring unit 110 is higher than the preset upper limit temperature of the battery pack 1. Conversely, the second comparator 132 may be configured to output the second temperature comparison signal if the measured temperature of the battery pack 1 is lower than the preset upper limit temperature of the battery pack 1.

If the first voltage comparison signal is received from the first comparator 131 and the first temperature comparison signal is from the second comparator 132, the control signal output unit 133 may be configured to output a turn-off control signal for changing the operating state of the heating relay 40 to a turn-off state.

Specifically, the control signal output unit 133 may receive the first voltage comparison signal in the case where a current is applied to the heating pad 30. In this case, the heating pad 30 may receive a current from the battery module 10 or a voltage source other than the battery module 10. In addition, the control signal output unit 133 may receive the first temperature comparison signal in the case where the measured temperature of the battery pack 1 is greater than or equal to the reference temperature. Therefore, if the temperature of the battery pack 1 is higher than or equal to the preset upper limit temperature and a current is applied to the heating pad 30, the control signal output unit 133 may output the turn-off control signal that changes the operating state of the heating relay 40 to a turn-off state.

For example, referring to FIG. 1, the control signal output unit 133 may output the turn-off control signal through a seventh line L7. The output turn-off control signal may be transmitted to the heating relay 40 through the seventh line L7.

The control signal output from the control signal output unit 133 will be described with reference to Table 1 below.

TABLE 1

| Voltage comparison signal | Temperature comparison signal | Control signal |
|---|---|---|
| First voltage comparison signal | First temperature comparison signal | Turn-off control signal |
| First voltage comparison signal | Second temperature comparison signal | Turn-on control signal |
| Second voltage comparison signal | First temperature comparison signal | Turn-on control signal |
| Second voltage comparison signal | Second temperature comparison signal | Turn-on control signal |

Table 1 is a table showing the control signal output according to the voltage comparison signal and the temperature comparison signal received by the control signal output unit 133.

Referring to Table 1, the control signal output unit 133 may output the turn-off control signal only when the first voltage comparison signal is received from the first comparator 131 and the first temperature comparison signal is received from the second comparator 132. That is, only in this case, the operating state of the heating relay 40 may be controlled to a turn-off state by the control signal output from the control signal output unit 133.

For example, the control signal output unit 133 may be configured as a NAND (Negative-AND) gate element. Here, the NAND gate is a logic circuit that emits a false output when all inputs are true. That is, in terms of a logic circuit, the first voltage comparison signal and the first temperature comparison signal may be true, and the second voltage comparison signal and the second temperature comparison signal may be false. Also, the turn-off control signal may be false, and the turn-on control signal may be true.

If the temperature of the battery pack 1 is higher than or equal to the reference temperature and the heating pad 30 receives a current from the battery module 10 or another voltage source, the heating pad control apparatus 100 according to an embodiment of the present disclosure may block the current applied to the heating pad 30, even without separate control by the processor 120.

Accordingly, the heating pad control apparatus 100 has an advantage of preventing the temperature of the battery pack 1 from rising above a certain level by blocking the current applied to the heating pad 30 as long as a predetermined condition is satisfied.

The processor 120 may be configured to receive the measured temperature signal from the measuring unit 110.

The measured temperature signal output from the measuring unit 110 may be input to the processor 120 as well as the second comparator 132.

For example, referring to FIG. 1, the measuring unit 110 may be connected to the processor 120 through the third line L3. That is, the third line L3 may include a unit line connecting the measuring unit 110 and the processor 120 and a unit line connecting the measuring unit 110 and the second comparator 132. Therefore, the processor 120 may receive the measured temperature signal from the measuring unit 110 through the third line L3.

The processor 120 may be configured to control the operating state of the heating relay 40 based on a result obtained by comparing the measured temperature measured by the measuring unit 110 with the set reference temperature.

Specifically, the operating state of the heating relay 40 may be controlled not only by the heating control unit 130 but also by the processor 120. That is, the heating control unit 130 and the processor 120 may control the operating state of the heating pad 30 by controlling the operating state of the heating relay 40 in a complementary relationship with each other. Accordingly, as the heating control unit 130 and the processor 120 control the operating state of the heating pad 30, the high-temperature state of the battery pack 1 may be effectively prevented from continuing.

For example, in the embodiment of FIG. 1, the processor 120 may receive the measured temperature signal from the measuring unit 110 through the third line L3 and determine the temperature of the battery pack 1 measured by the measuring unit 110 by reading the received measured temperature signal. In addition, the processor 120 may compare the determined temperature of the battery pack 1 with the preset reference temperature and output a signal for controlling the operating state of the heating relay 40 through an eighth line L8. Here, if the determined temperature of the battery pack 1 is equal to or higher than the preset reference temperature, the processor 120 may output a signal for controlling the operating state of the heating relay 40 to a turn-off state through the eighth line L8. Conversely, if the determined temperature of the battery pack 1 is lower than the preset reference temperature, the processor 120 may output a signal for controlling the operating state of the heating relay 40 to a turn-on state through the eighth line L8.

Therefore, the heating pad control apparatus 100 according to an embodiment of the present disclosure prevents the temperature of the battery pack 1 from rising above the reference temperature doubly by using the heating control unit 130 and the processor 120, thus has an advantage of remarkably reducing the risk of accidents caused by the temperature rise of the battery pack 1.

A specific configuration of the heating relay 40 will be described with reference to FIG. 6.

Figure 6:
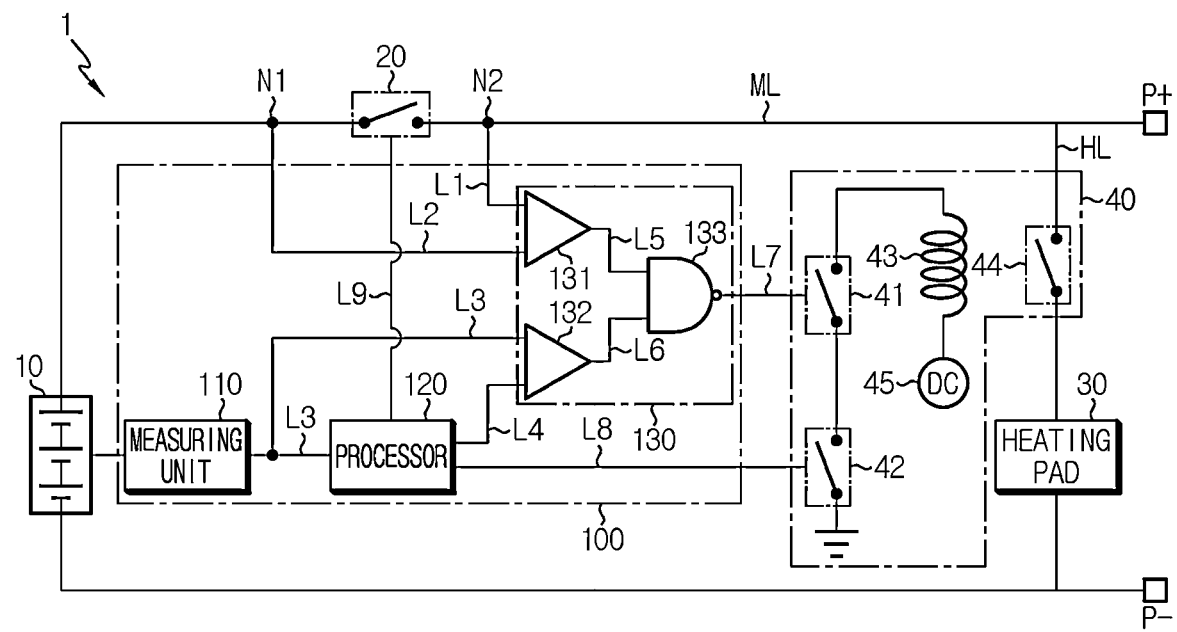
FIG. 6 is a diagram showing another exemplary configuration of the battery pack including the heating pad control apparatus according to an embodiment of the present disclosure.

FIG. 6 is a diagram showing another exemplary configuration of the battery pack 1 including the heating pad control apparatus 100 according to an embodiment of the present disclosure.

Referring to FIG. 6, the heating relay 40 may include a first relay 41, a second relay 42, an inductor 43, a third relay 44, and a voltage source 45.

For example, the first relay 41 and the second relay 42 may be a metal-oxide-semiconductor field effect transistor (MOSFET). In addition, the third relay 44 may include a contact point and an ion piece. That is, the ion piece moves by a magnetic force generated when a current flows through the inductor 43. Also, if the ion piece comes into contact with the contact point, the operating state of the third relay 44 may be a turn-on state.

The first relay 41 may be connected to the control signal output unit 133 through the seventh line L7, and the second relay 42 may be connected to the processor 120 through the eighth line L8. However, the connection relationship among the first relay 41, the second relay 42, the control signal output unit 133 and the processor 120 is not limited to that shown in the drawing, and the first relay 41 may also be connected to the processor 120, and the second relay 42 may be connected to the control signal output unit 133. That is, the first relay 41 may be connected to any one of the control signal output unit 133 and the processor 120, and the second relay 42 may be connected to any one of the control signal output unit 133 and the processor 120, which is not connected to the first relay 41. Hereinafter, as illustrated in FIG. 6, it will be described that the first relay 41 is connected to the control signal output unit 133 and the second relay 42 is connected to the processor 120.

The first relay 41 may receive the control signal from a control signal output unit 133 through the seventh line L7, and the operating state of the first relay 41 may be changed to correspond to the received control signal. In addition, the second relay 42 may receive a signal from the processor 120 through the eighth line L8, and the operating state of the second relay 42 may be changed to correspond to the received signal.

That is, the operating state of the first relay 41 may be changed by the heating control unit 130 according to the state of the battery pack 1, without being controlled by the processor 120.

For example, it is assumed that the heating relay 40 does not include the first relay 41 and that the processor 120 and the second relay 42 are disconnected due to damage of the eighth line L8 when the operating state of the second relay 42 is a turn-on state. In this case, since a current may flow through the heating line HL, the current may be continuously applied to the heating pad 30. In addition, if the load 2 is connected as shown in FIG. 5, even if the operating state of the main relay 20 is controlled to a turn-off state by the processor 120, the current may be applied to the heating pad 30 through the load 2. Thus, the heating pad 30 continuously generates heat, and the temperature of the battery pack 1 may rise above the reference temperature. That is, when only the second relay 42 is provided, there is a problem that the battery pack 1 may be damaged due to a defect in the connection between the processor 120 and the second relay 42 or in the processor 120 itself.

Meanwhile, even when both the first relay 41 and the second relay 42 are provided in the heating relay 40 as in the present disclosure, it is assumed that the processor 120 and the second relay 42 is disconnected due to the damage of the eighth line L8. In this case, if a current flows through the heating line HL, a voltage difference between the first node N1 and the second node N2 may be smaller than a predetermined size. Accordingly, the first comparator 131 may output the first voltage comparison signal, which is a true value, to the control signal output unit 133 through the fifth line L5. In addition, if the temperature of the battery pack 1 is equal to or higher than the reference temperature, the second comparator 132 may output the first temperature comparison signal, which is a true value, to the control signal output unit 133 through the sixth line L6. Referring to Table 1, the control signal output unit 133 receiving the first voltage comparison signal and the first temperature comparison signal may output the turn-off control signal through the seventh line L7. In this case, the operating state of the first relay 41 is changed to a turn-off state, and the current applied to the heating pad 30 may be blocked.

Conversely, if the control signal output unit 133 does not normally output the control signal according to Table 1 since a defect occurs in the heating control unit 130, the processor 120 may control the operating state of the second relay 42 to prevent the battery pack 1 from maintaining a high-temperature state.

Therefore, the heating pad control apparatus 100 according to an embodiment of the present disclosure has an advantage of effectively preventing the battery pack 1 from maintaining a high-temperature state by including both the processor 120 and the heating control unit 130, which are complementary with each other.

The heating pad control apparatus 100 according to the present disclosure may be provided in the battery pack 1. That is, battery pack 1 according to the present disclosure may include the heating pad control apparatus 100 described above and at least one battery cell. In addition, the battery pack 1 may further include electrical equipment (a relay, a fuse, etc.) and a case.

In addition, the heating pad control apparatus 100 according to the present disclosure may be provided in a vehicle. Preferably, the heating pad control apparatus 100 according to the present disclosure may be provided in an electric vehicle. More preferably, the battery pack 1 including the heating pad control apparatus 100 according to the present disclosure may be provided in an electric vehicle. Therefore, the heating pad control apparatus 100 may minimize damage to internal components of the vehicle by preventing the battery pack 1 from maintaining a high-temperature state.

The embodiments of the present disclosure described above may not be implemented only through an apparatus and method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

1: battery pack
2: load
10: battery module
20: main relay
30: heating pad
40: heating relay
41: first relay
42: second relay
43: inductor
44: fourth relay
45: voltage source
100: heating pad control apparatus
110: measuring unit
120: processor
130: heating control unit
131: first comparator
132: second comparator
133: control signal output unit

What is claimed is:

1. A heating pad control apparatus connected to a battery pack, the heating pad control apparatus comprising:
a sensor configured to measure a temperature of the battery pack and output a measured temperature signal corresponding to the measured temperature of the battery pack;
a processor configured to output a reference temperature signal corresponding to a preset reference temperature; and
a heating control circuit configured to receive both-end voltages of a main relay disposed between a positive electrode terminal of a battery module of the battery pack and a positive electrode terminal of the battery pack on a main charging and discharging line, receive the measured temperature signal from the sensor, receive the reference temperature signal from the processor, and output a control signal for controlling a heating relay, wherein the heating relay is disposed on a heating line to generate heat on the main charging and discharging line when a current flows in the heating line, wherein the heating relay is controllable to cause the current to flow in the heating line, and wherein the control signal output by the heating control circuit is based on the both-end voltages of the main relay, the measured temperature signal and the reference temperature signal to control operation of a heating pad disposed on the heating line.

2. The heating pad control apparatus according to claim 1, wherein the heating control circuit is configured to output a turn-on control signal that causes the heating relay to change to a turn-on state so that the main charging and discharging line and the heating pad are connected.

3. The heating pad control apparatus according to claim 2, wherein in response to the main relay being on and the heating relay being in the turn-on state, the heating pad is configured to receive a current output from the battery module.

4. The heating pad control apparatus according to claim 1, wherein the heating control circuit includes:
a first comparator configured to receive a first end voltage and a second end voltage of the main relay, respectively, and output a voltage comparison signal corresponding to a difference between the first end voltage and the second end voltage of the main relay;
a second comparator configured to output a temperature comparison signal corresponding to a result obtained by comparing sizes of the received measured temperature signal and the received reference temperature signal; and a control signal output circuit configured to receive the voltage comparison signal and the temperature comparison signal and output a control signal corresponding to values of the voltage comparison signal and the temperature comparison signal.

5. The heating pad control apparatus according to claim 4, wherein the first comparator is configured to output a first voltage comparison signal in response to the difference between the first and second end voltages being smaller than a predetermined size, and the first comparator is configured to output a second voltage comparison signal in response to the difference between the first and second end voltages being greater than or equal to the predetermined size.

6. The heating pad control apparatus according to claim 5, wherein the second comparator is configured to output a first temperature comparison signal in response to the value corresponding to the measured temperature signal being greater than or equal to a value corresponding to the reference temperature signal, and the second comparator is configured to output a second temperature comparison signal in response to the value corresponding to the measured temperature signal being smaller than the value corresponding to the reference temperature signal.

7. The heating pad control apparatus according to claim 6, wherein in response to the first voltage comparison signal being received from the first comparator and the first temperature comparison signal being received from the second comparator, the control signal output circuit is configured to output a turn-off control signal that causes the heating relay to change from the turn-on state to a turn-off state.

8. The heating pad control apparatus according to claim 1, wherein the processor is configured to receive the measured temperature signal from the sensor and control the heating relay based on a result obtained by comparing the measured temperature measured by the sensor and the preset reference temperature.

9. A battery pack, comprising the heating pad control apparatus according to claim 1.

10. A vehicle, comprising the heating pad control apparatus according to claim 1.

* * * * *